United States Patent
Takanashi et al.

(10) Patent No.: US 6,411,391 B1
(45) Date of Patent: Jun. 25, 2002

(54) CRYSTAL SECTION SHAPE MEASURING METHOD

(75) Inventors: Keiichi Takanashi, Nishinomiya; Kazuo Hiramoto, Sanda; Tokuji Maeda, Kohoku-machi, all of (JP)

(73) Assignee: Sumitomo Metal Industries. Ltd., Osaka (JP)

( * ) Notice: Subject to any disclaimer, the term of this patent is extended or adjusted under 35 U.S.C. 154(b) by 0 days.

(21) Appl. No.: 09/429,107

(22) Filed: Oct. 28, 1999

(30) Foreign Application Priority Data

Nov. 6, 1998 (JP) .............................. 10-316248

(51) Int. Cl.[7] .............................................. C30B 15/26
(52) U.S. Cl. ...................... 356/604; 356/30; 356/635; 117/14
(58) Field of Search ...................... 356/30, 603, 604, 356/606, 607, 608, 635; 117/14, 15

(56) References Cited

U.S. PATENT DOCUMENTS 5,886,737 A * 3/1999 Hiraishi ........................ 348/86

6,111,262 A * 8/2000 Takanashi ............... 250/559.19
6,171,391 B1 * 1/2001 Fuerhoff et al. ............. 117/14
6,226,032 B1 * 5/2001 Lees et al. ..................... 348/85

FOREIGN PATENT DOCUMENTS

JP          9-40151         7/1995
JP          9-100194        10/1995

* cited by examiner

*Primary Examiner*—Richard A. Rosenberger
(74) *Attorney, Agent, or Firm*—Morrison & Foerster LLP (57) ABSTRACT

A method of measuring a crystal section shape of a crystal being pulled from a crystal melt while rotating, including taking an image of the base of the crystal in horizontal and vertical directions with a two-dimensional camera set at an upper oblique position over the crystal; setting at least two horizontal light measuring lines in the image taken by the two-dimensional camera, being arranged in parallel in the vertical direction; detecting pairs of intersection points, at which a fusion ring intersects the two horizontal light measuring lines; transforming a position of each of the intersection points into a position of a point located on a line passing through a crystal center; determining diameters of the crystal based on the transformed positions and on time lags between two intersection points of each of the pairs of intersection points.

10 Claims, 9 Drawing Sheets

CRYSTAL SECTION SHAPE MEASURING METHOD

CROSS-REFERENCE TO RELATED APPLICATIONS:

This application claims priority from Japanese Application No. JP 10-316248 filed Nov. 6, 1998, the entire content of which is hereby incorporated by reference.

BACKGROUND OF THE INVENTION

1. Field of the Invention

The present invention relates to a crystal section shape measuring method which optically measures the sectional shape of a single crystal pulled by the Czochralski method (CZ method).

2. Description of the Related Art

Figure 7:
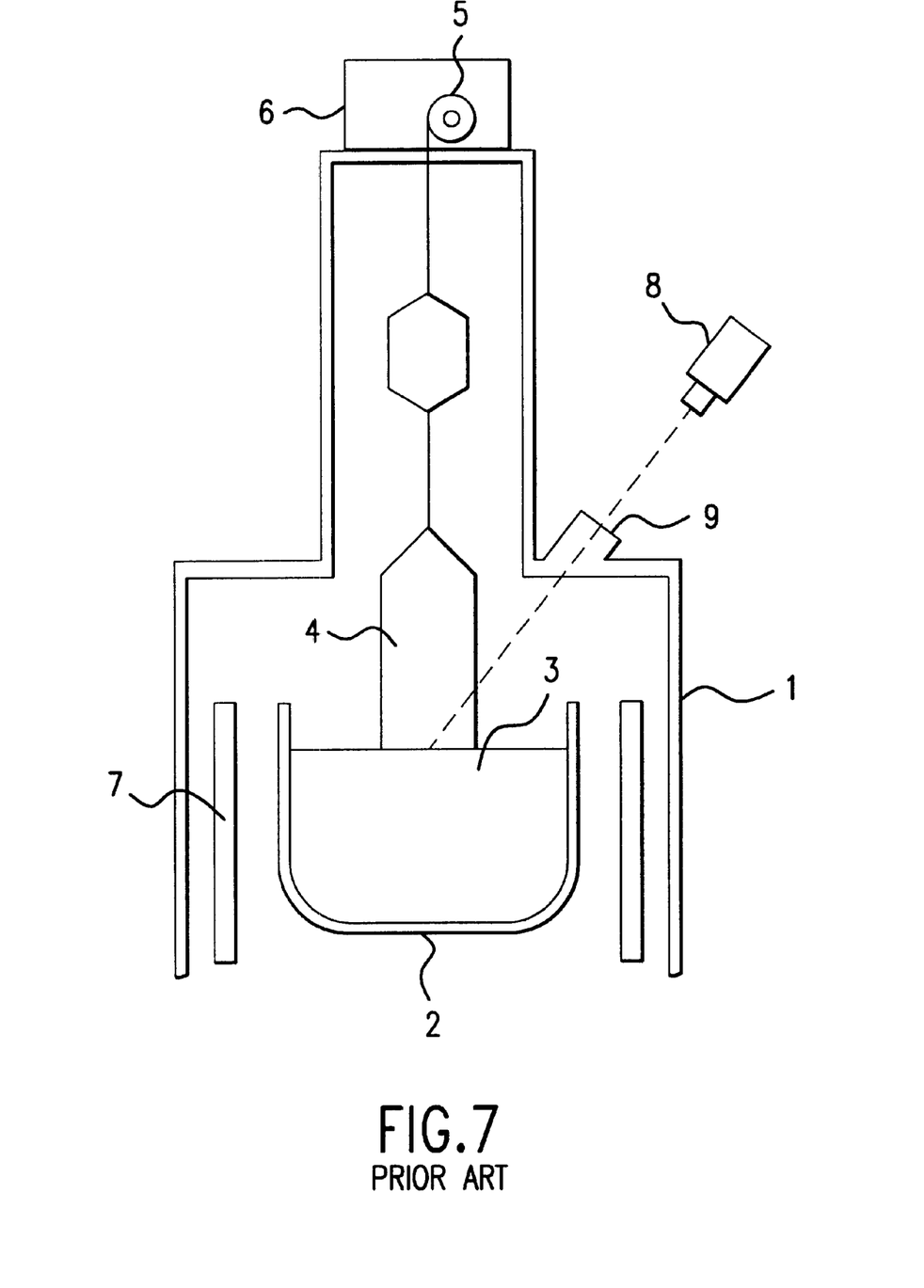
FIG. 7 is a configuration view of the conventional apparatus for pulling the single crystal by the CZ method.

The CZ method is one of the methods for producing single crystal as the raw material for a semiconductor. In the CZ method, as shown in FIG. 7, a crucible 2 provided in a furnace body 1 of the CZ furnace is filled with a crystal melt liquid 3, from which the single crystal 4 is pulled by a pulling apparatus 5 while being rotated by a rotating apparatus 6. Upward motion of the crucible 2 is controlled in such a way that the heating center of a heater 7 keeps a constant relative position with the liquid level, in order to evenly heat the crystal melt liquid 3 by the heater 7.

It is preferable that the single crystal 4 takes a target shape at its upper and lower ends while being pulled. It is also preferable that the crystal body and seed crystal have a uniform diameter equal to the target value during the same process. Moreover, it is preferable to keep its deformation factor [(maximum diameter -minimum diameter)/minimum diameter], representing distortion from the roundness of the sectional shape of the single crystal 4, at an allowable level.

As for the product quality, it is preferable to control the density of oxidation-induced stacking faults (hereinafter referred to as OSF) to a low level. OSF, as one of the crystal evaluation criteria, is a stacking fault caused by the phenomenon wherein oxygen, dissolved in the crystal to form a solid solution, separates out as an oxide while the crystal is thermally treated for oxidation. The OSF density decreases as pulling speed increases because of the accelerated quenching of the crystal. It is therefore preferable to increase the pulling speed. This also advantageously increases production efficiency.

However, increasing the pulling speed increases the deformation factor, possibly beyond the allowable limit, thus decreasing product yield. It is therefore preferable to set the optimum pulling speed at which the crystal is pulled while keeping the deformation factor within an allowable range, for improved single crystal yield and production efficiency and securing product quality. It is therefore important to accurately measure the sectional shape of the single crystal while it is pulled and thereby to accurately determine its deformation factor.

The known methods for measuring the sectional shape of the single crystal being pulled by the CZ method falls into two general categories. One is the weight method, which tries to determine the crystal diameter from its weight, and the other is the optical method, which tries to determine the crystal diameter using an optical apparatus, such as a CCD camera.

Figure 9:
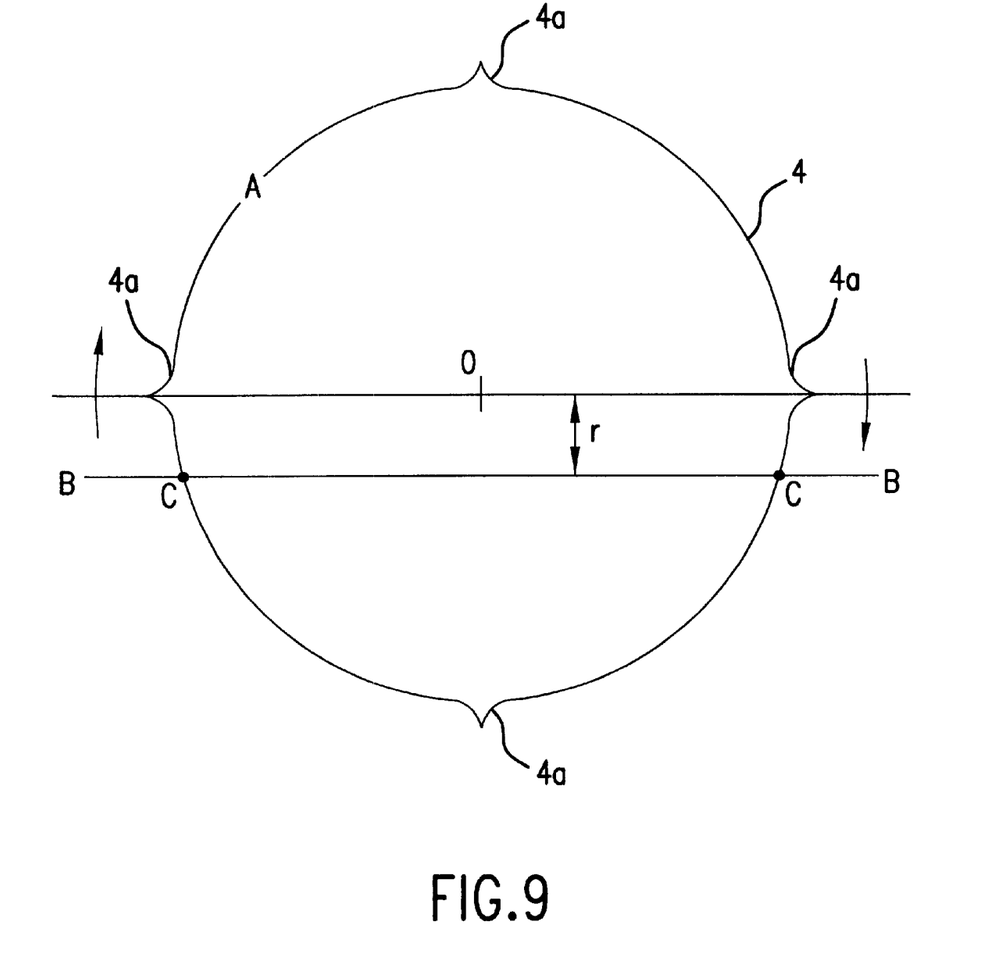
FIG. 9 is a model planar view showing the relationship between the light measuring line and crystal center.

Pulling the crystal by the CZ method, however, is accompanied by the formation of projections 4a, referred to as crystal habit lines, regularly formed in the peripheral direction on the outer peripheral face of the single crystal 4, as shown in FIG. 9. The projections 4a extend in the crystallographic axis direction, and are formed at peripheral positions characteristic of the crystal orientation of the single crystal 4. In order to accurately determine the deformation factor of the crystal, it is preferable to measure the shape of the crystal habit portions.

The weight method, which tries to determine the crystal diameter from the weight and length of the single crystal pulled, covers only the average diameter and is incapable of measuring the detailed sectional shape involving the crystal habit lines. The optical method, on the other hand, measures the shape more accurately than the weight method, because it reads the diameter of the fusion ring high in brilliance, formed at the interface between the crystal melt liquid and the single crystal, as the diameter of the crystal.

Figure 8:
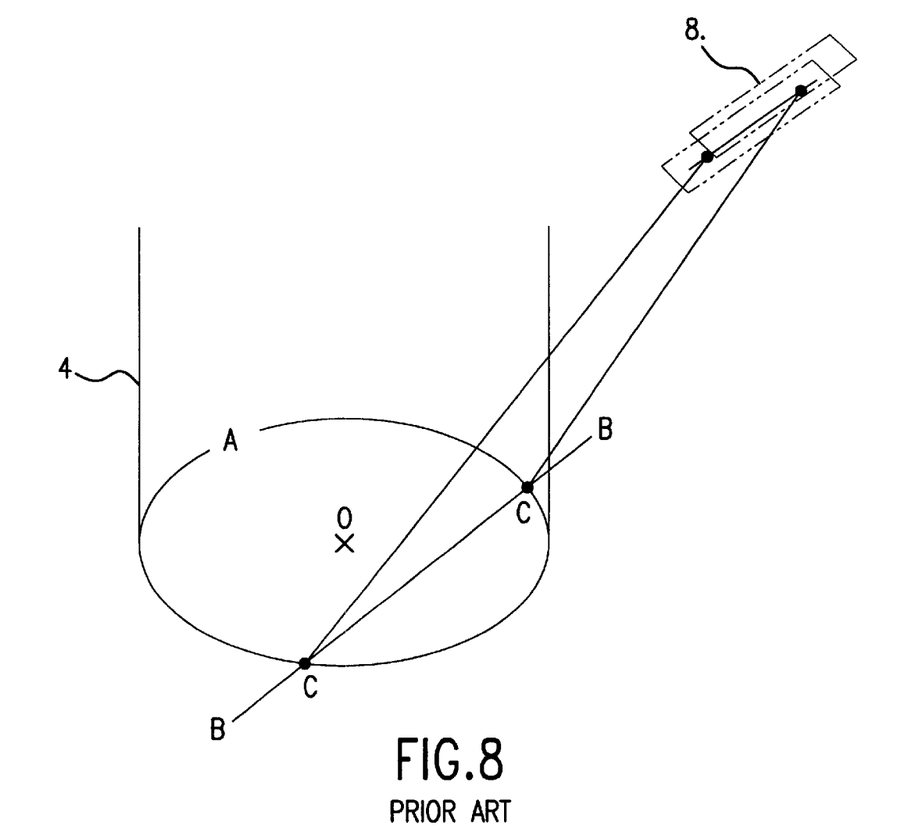
FIG. 8 is a conceptual view of the diameter measurement performed in a conventional method.

The optical method, as shown in FIG. 7, takes an image (measures light) of the base of the single crystal 4 by an optical apparatus, e.g., a one-dimensional CCD camera 8, set at an upper oblique position over the crystal 4, through a window 9 provided at the top of the furnace body 1. The points C and C, at which the fusion ring A formed around the base of the single crystal 4 intersects the light measuring line B—B, are located from the brilliance change at these points C and C, in order to measure sectional shape of the crystal 4, as shown in FIG. 8.

More precisely, the intersection points C and C are continuously located, while the single crystal 4 makes one rotation, to find the interval $W(\alpha)$ between the points C and C by the following equation:

$$W(\alpha)=L(\alpha)-R(\alpha)$$

wherein, $L(\alpha)$ and $R(\alpha)$ are the detected positions of the intersection points C and C, and $\alpha$ is the angle of rotation of the single crystal. The diameter across the entire periphery of the single crystal 4 is thus measured.

However, when the one-dimensional CCD camera 8 is set in such a way that its light measuring line B—B passes through the crystal center O, the fusion ring A will stand in the single crystal 4's light when the diameter of the crystal diminishes, causing a measuring error and perhaps making the measurement impossible.

In the actual pulling process, therefore, the one-dimensional CCD camera 8 is set in such a way as to take a photograph (measures light) of the crystal center O of the single crystal 4's base on the side of the camera. As a result, the light measuring line B—B intersects the fusion ring A on the camera side from the crystal center O. In this case, the crystal diameter is determined by the following equation from the interval W between the intersection points C and C, measured by the one-dimensional CCD camera 8:

$$D=(W^2+4r^2)^{1/2}$$

wherein,

D is the crystal diameter,

W is the interval between intersection points C and C, and r is the distance from the crystal center O to the light measuring line B—B.

However, when the one-dimensional CCD camera 8 is set in such a way as to have the light measuring line B—B on the camera side (this side) from the crystal center O, two crystal habit lines 4a and 4a, opposite each other about the crystal center O, cannot pass the light measuring line B—B simultaneously, the one following the other to pass the line.

Therefore, accuracy of diameter measurement decreases significantly, when the diameter is measured in the vicinity of the crystal habit line 4a by the conventional optical method, which tries to determine the distance W between the intersection points C and C from the difference between the detected C positions $L(\alpha)$ and $R(\alpha)$.

Furthermore, none of the presently known methods can accurately sense the liquid level for controlling upward motion of the crucible, which means that the measured liquid level invariably involves an error. As a result, the light measuring line B—B of the one-dimensional CCD camera 8 will deviate from the initially set position, causing the distance (r) between the crystal center O and the light measuring line B—B to change. The measured diameter D therefore. involves an error.

In order to solve these problems, Japanese Patent Laid-open No. 63-256594 discloses a method which moves the light measuring line B—B of the. one-dimensional CCD camera 8 in the direction perpendicular to the line, trying to find the true diameter from the crystal diameters determined before and after the movement and from the distance of the movement. However, even this method cannot avoid the decreased accuracy of the diameter measurement in the vicinity of the crystal habit line, because the light measuring line is apart from the crystal center.

Under these circumstances, the inventors of the present invention have proposed (Japanese Patent Laid-Open No. 9-100194) a method for measuring the crystal diameter, comprising of steps: (1) separately detecting the two points, positions $L(\alpha)$ and $R(\alpha)$, at which the fusion ring A and light measuring line B—B intersect each other on each side; (2) finding a timing lag $\theta$ for detecting the positional changes of these points, determined by the camera's measuring line position; and (3) comparing these positions $L(\alpha)$ and $R(\alpha)$ with each other after removing the timing lag $\theta$, to prevent decreased accuracy of the diameter measured in the vicinity of the crystal habit line, caused by the light measuring line B—B being apart from the crystal center O.

The single crystal pulled by the CZ method has the crystal habit lines in the peripheral direction on the outer peripheral face of the crystal at positions characteristic of the crystal orientation, as mentioned earlier. For example, the crystal habit lines appear at intervals of 90° for the crystal orientation (100). The single crystal is rotated in the peripheral direction while it is being pulled, and the intersection points of the fusion ring A and light measuring line B—B of the one-dimensional CCD camera change in their positions when the line crosses the crystal habit line. For the crystal orientation of (100), the intersecting position changes at intervals of 90°.

The positional changes of the intersection points occur simultaneously on both sides when the light measuring line B—B passes the crystal center O, but there is a timing lag of these positional changes as the line B—B leaves the crystal center O, the lag $\theta$ becoming larger as the distance (r) between the crystal center O and line B—B increases.

The inventors of the present invention have developed (Japanese Patent Application Laid-Open No. 9-100194) a crystal diameter measuring method with which the decreased accuracy of the diameter measured in the vicinity of the crystal habit line, resulting from the light measuring line B—B being apart from the crystal center O, can be prevented. This is achieved by comparing the positions $L(\alpha)$ and $R(\alpha)$ of O, the intersection points on both sides, with each other after removing the timing lag $\theta$ of positional changes of these points from the detected positions $L(\alpha)$ and $R(\alpha)$.

The inventors of the present invention have also developed another crystal diameter measuring method (Japanese Patent Laid-Open No. 9-40151), which can prevent not only the decreased accuracy of the diameter measured in the vicinity of the crystal habit line resulting from the light measuring line B—B being apart from the crystal center O, but also the decreased accuracy of the measured diameter resulting from shaking motion of the crystal.

The single crystal being pulled by the CZ method is shaken at a frequency of 1 to 4 oscillations for every one rotation. When the single crystal is shaken in the lateral direction, viewed from the optical appliance, the effect of shaking can be removed by finding the difference between the positions $L(\alpha)$ and $R(\alpha)$, to solve the shaking-caused problems. When it is shaken back and forth, on the other hand, the accuracy of the diameter measurement decreases as a result of the changed distance between the light measuring line B—B and the crystal center O. However, the single crystal is shaken in a complex manner when it is actually pulled, which is a major cause for the decreased accuracy of diameter measurement, even when the detected positions $L(\alpha)$ and $R(\alpha)$ are compared with each other to remove the effect of the timing lag $\theta$ for detecting the positional changes of intersection points.

In view if this problem, the inventors of the present invention have developed (Japanese Patent Application No. 9-40151) yet another crystal diameter measuring method with which the accuracy of the diameter measurement can be further improved by removing the component due to the shaking motion of the single crystal from the detected positional data of the intersection points on both sides, because it removes not only the measurement error resulting from the timing lag for detecting the positional changes of these points caused by the crystal habit line, but also the effect of the shaking motion of the single crystal. One of the useful methods for removing the component due to the shaking motion of the single crystal from the detected positional data of the intersection points on both sides is the Fast Fourier Transform (FFT), applied to the detected positional data to find their frequency components, and removes the frequency component of the lower order, corresponding to the shaking period of the single crystal, from each of the frequency components found.

SUMMARY OF THE INVENTION

The response, speed of the optical apparatus used to detect the intersection point positions on both sides is essential. It is preferable, as indicated by the results of analysis of crystal section shapes, that the measurement pitch is 2° or less in terms of the angle of rotation of the single crystal, in order to accurately measure the crystal section shape in the vicinity of the crystal habit line. It is therefore preferable in a diameter measuring method to secure a response time of the optical apparatus in such a way that it works at a measurement pitch of 2° or less.

A one-dimensional CCD camera as the optical apparatus can cope with high speed pulling because it is now developed to work at a relatively high speed. However, it is preferable to accurately position the crystal center and set the light measuring line, in order to accurately determine the diameter of the crystal. This requires the one-dimensional CCD camera to be set at a varying position in such a way as to follow the changed crystal center position, needing many additional steps. It is possible to automatically set the light measuring line by mechanical scanning, at an additional cost. These problems can be solved by the use of a two-dimensional CCD camera.

An ordinary two-dimensional CCD camera works at a response speed of 30 frames/s. However, the high-speed pulling needs a high-speed camera, which is much more expensive than an ordinary one. It should also be noted that a two-dimensional CCD camera generally has a smaller number of camera picture elements in the horizontal direction, and hence tends to be lower in accuracy of the measured crystal section shape than a one-dimensional CCD camera. It is difficult for a two-dimensional CCD camera, having an increased number of camera picture elements for improved resolution, to also satisfy the response time requirement.

Therefore, there is a need for a method which uses a two-dimensional CCD camera to measure the diameter of a crystal being pulled at a high speed and at a measurement pitch of 2° or less.

It is an object of the present invention to provide a high-precision, economical crystal section shape measuring method, which uses a two-dimensional CCD camera to measure the crystal diameter at a measurement pitch of 2° or less even when the crystal is pulled at a high speed.

In order to attain the above object, the crystal section measuring method of the present invention comprises steps of: (1) taking an image with a two-dimensional CCD camera of the base of a single crystal on the side of the camera, the single crystal being pulled by the CZ method from a crystal melt liquid while rotating, the two-dimensional CCD camera being set at an upper oblique position over the single crystal, in the horizontal and vertical directions; (2) setting in the image taken by the two-dimensional CCD camera, two or more horizontal light measuring lines, arranged in parallel to each other in the vertical direction; (3) separately detecting the intersection positions, i.e. the points on both sides at which the fusion ring intersects the light measuring line on each light measuring line; (4) combining the pair of the intersection points obtained on each light measuring line to interpolate the space between the measurement pitches, determined by the camera's response speed and the crystal rotational speed; and (5) comparing the detected positions of the intersection points on both sides with each other, subsequent to the interpolation for the space between pitches, after removing the timing lag for detecting the positional changes of these points, in order to measure the distance between the intersection points on each light measuring line and thereby to determine the single crystal section shape.

Thus, the method of the present invention allows to measure the distance between the intersection points on both sides, at a pitch smaller than that determined by the camera's response speed and crystal rotational speed.

It is preferable, in order to improve the measurement accuracy for the crystal section measuring method of the present invention, to remove the effect of the shaking motion of the single crystal by separately processing a pair of the intersection points on each light measuring line by FFT, and estimating the component due to the shaking motion of the crystal which is to be subtracted from the detected positional data of the intersection points on each light measuring line.

It is also preferable to automatically set two or more horizontal light measuring lines in the image taken by the two-dimensional CCD camera in accordance with the camera's response speed and crystal rotational speed, in order to improve the operation of the present invention.

For finding the crystal center position, a simple and preferable procedure is to scan the horizontal light measuring lines in the vertical direction in the image taken by the two-dimensional CCD camera during the seed drawing process, and find the midpoint between the intersection points on the horizontal plane on which the distance between the intersection points with the fusion ring around the seed crystal becomes the largest.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
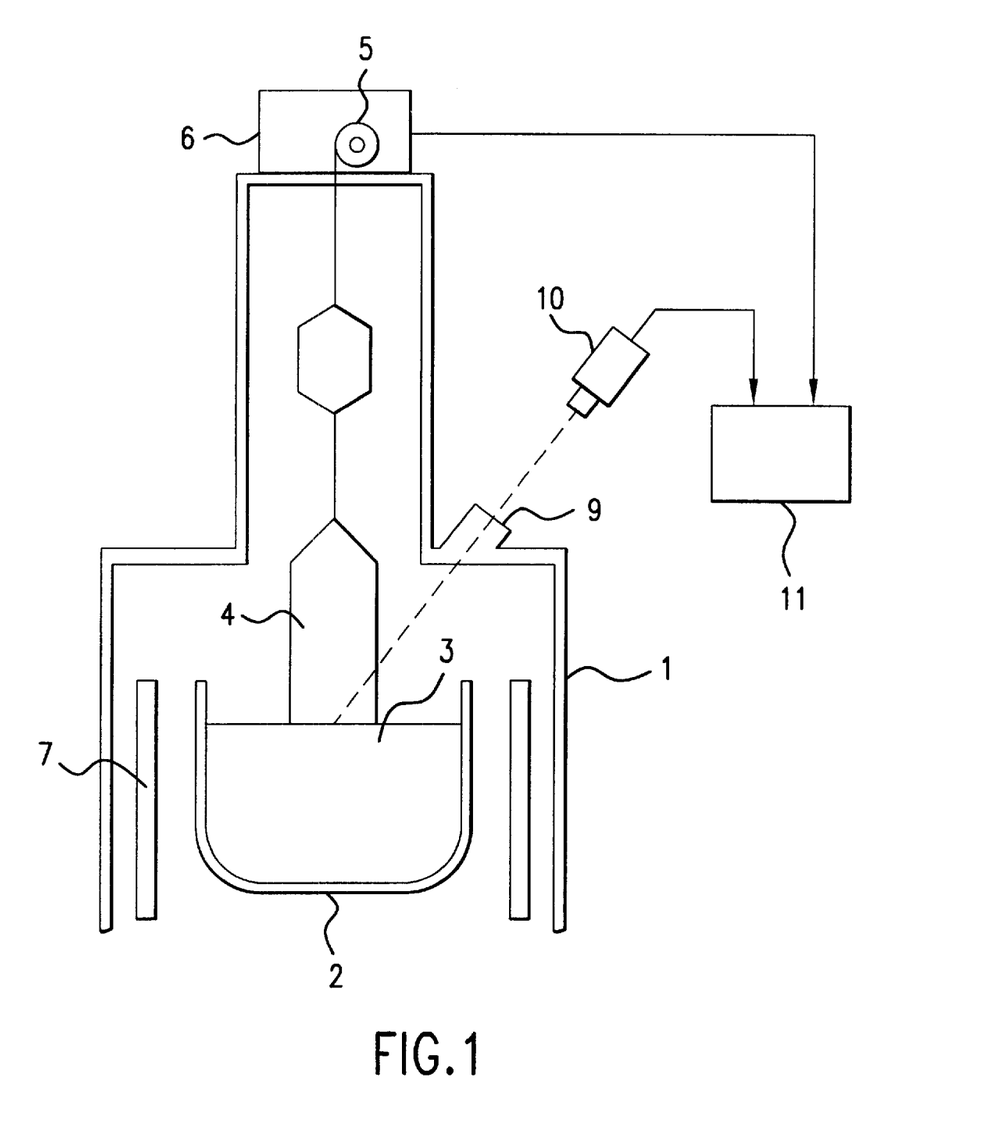
FIG. 1 is a configuration view of the apparatus for pulling the single crystal, used for one embodiment of the crystal section shape measuring method of the present invention.
Figure 2:
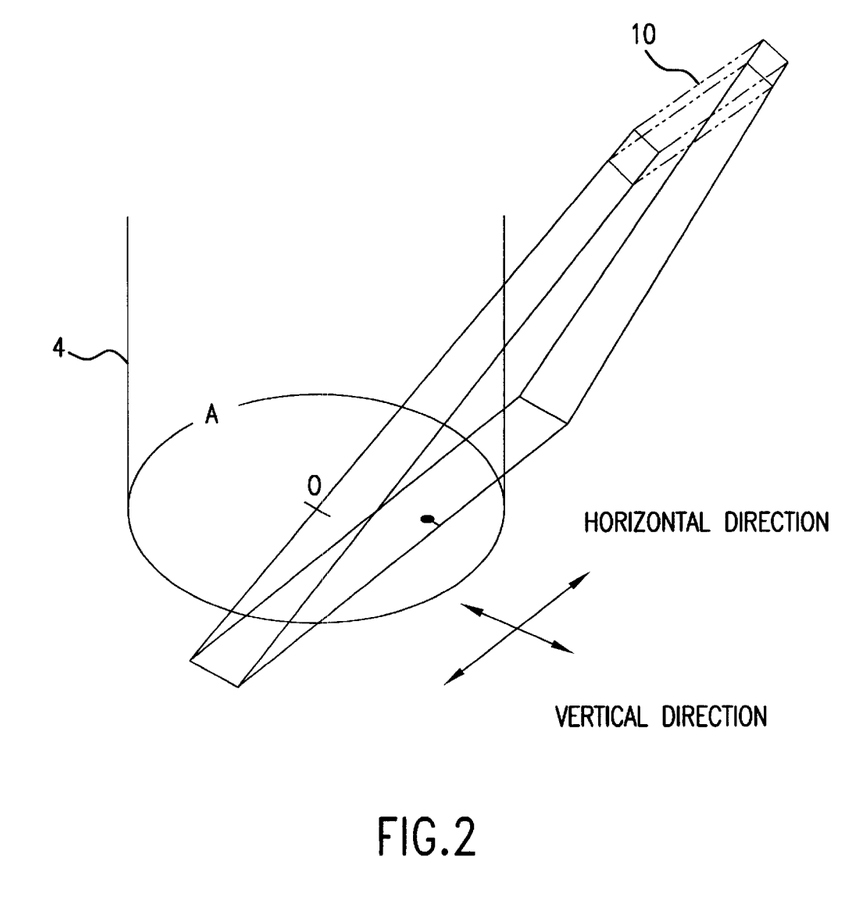
FIG. 2 is a conceptual view of the diameter measurement by the crystal section shape measuring method of the present invention.
Figure 3:
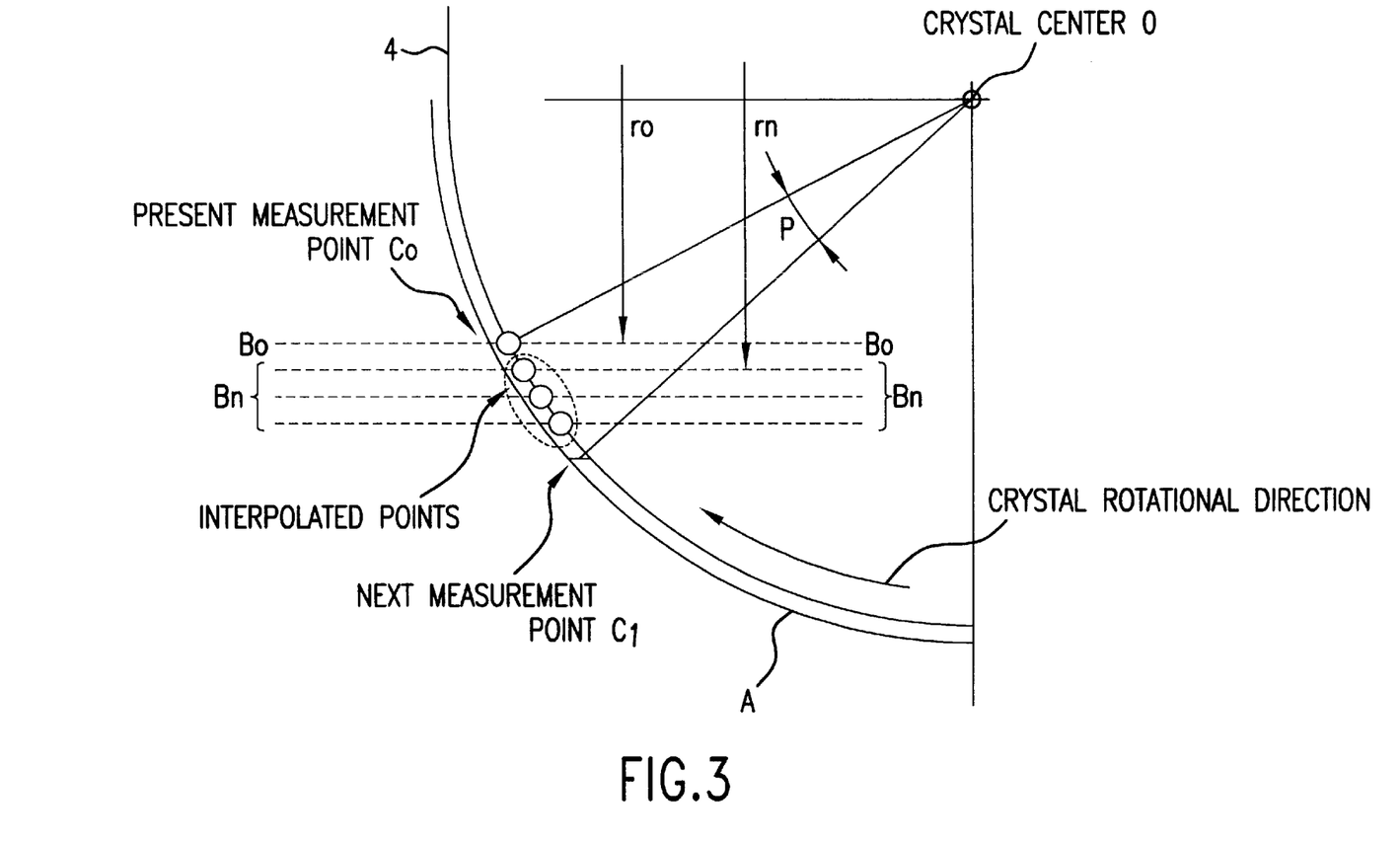
FIG. 3 is a conceptual view of the measurement speed interpolation for the crystal section shape measuring method of the present invention.

Referring now to the drawings, wherein like reference numerals designate identical or corresponding parts throughout the several views, a first embodiment of the present invention as shown in FIGS. 1–3 is described. The crystal section shape measuring method of the present invention takes an image of the base of a single crystal 4 by a two-dimensional CCD camera 10, set at an upper oblique position over the crystal 4, through a window 9 provided at the top of furnace body 1. More precisely, the camera 10 takes the image of the base of the single crystal 4 in the horizontal and vertical directions, where the fusion ring A formed around the single crystal 4 intersects both sides of the rectangular photographing region, as shown in FIG. 2.

The procedure for pulling the single crystal 4 was described above, i.e., the single crystal is pulled by a:pulling apparatus 5 from a crystal melt liquid 3 filling a crucible 2 installed in a CZ furnace body 1, while being rotated by a rotating apparatus 6. Upward motion of the crucible 2 is controlled in such a way that the heating center of a heater 7 keeps a constant relative position with the liquid level, in order to evenly heat the crystal melt liquid 3 by the heater 7.

The image data taken by the two-dimensional CCD camera 10 is transmitted to a processing unit 11, together with the rotational speed data of the single crystal 4, transmitted from the rotating apparatus 6. The processing unit 11 processes these inputted data to automatically set two or more light measuring lines in the image taken by the two-dimensional CCD camera 10 by the procedure described below, and detect intersection points of the fusion ring A and light measuring line on each light measuring line, thereby determining the sectional shape of the crystal 4.

The automatic setting of the light measuring lines is illustrated in FIG. 3. The two or more horizontal, light measuring lines, Bo—Bo and Bn—Bn (n=1, . . . , k−1) arranged in parallel to each other in the vertical direction, are automatically set in the image taken by the two-dimensional CCD camera 10.

More precisely, the base light measuring line Bo—Bo is set at r=ro (mm) as the distance from the crystal section center O. It should be noted that the crystal center position fluctuates by batch. It is therefore preferable to accurately grasp the crystal center position, in order to accurately set each light measuring line. In the method of the present invention, the crystal center position is automatically measured for each batch during the seed drawing step in the crystal pulling step, where one horizontal light measuring line is set in the image taken by the two-dimensional CCD camera 10 and scanned in the direction perpendicular to the image, to detect the intersection points of the fusion ring and light measuring line, when the former appears on the latter. The midpoint between the intersection points having the largest distance between them on the light measuring line is taken as the crystal center position.

When the crystal center position is automatically measured and the base light measuring line Bo—Bo is set at r=ro (mm) as the distance from the crystal section center O, the point Co at which the base light measuring line Bo—Bo intersects the fusion ring A is measured. The next intersection point $C_1$ to be measured is apart from the point Co by a measurement angle pitch P, which is given by the following equation:

$$P=360\times[60/(s\times v)] \quad (1)$$

where, (s) is the crystal rotational speed (rpm) and (v) is camera's response time (sec.).

The conventional method, measuring the intersection points only on the base light measuring line Bo—Bo, detects the intersection point positions L(α) and R(α) on both sides, only at intervals of a measurement angle pitch P. Therefore, it is difficult to accurately measure the crystal section shape in the vicinity of the crystal habit line, when the response speed of the camera is sufficiently slower than the crystal rotational speed so as to make the crystal diameter measurement pitch larger than 2°.

On the other hand, the crystal shape measuring method of the present invention sets the (k−1) interpolated light measuring lines Bn—Bn (n=1, . . . , k−1) between the points Co and $C_1$ at intervals of a pitch p (=P/k), which is 2° or less, on the image taken by the two-dimensional CCD camera 10. Thus, a measurement angle pitch of 2° or less can be secured, even when the measurement angle pitch P determined by the camera's response speed and crystal rotational speed exceeds 2°.

The distance rn (mm) of the interpolated light measuring line Bn—Bn (n=1, . . . , k−1) from the crystal section center O is given by the numerical equation (2), when the crystal rotates clockwise to determine the interpolated light measuring line Bn—Bn, based on the left intersection point position on the base light measuring line Bo—Bo. On the other hand, when the crystal rotates counterclockwise to determine the interpolated light measuring line Bn—Bn, based on the left intersection point position on the base light measuring line Bo—Bo, it is given by the numerical equation (3):

$$rn=ro\cdot\cos(n\cdot p)+(R^2-ro^2)^{1/2}\cdot\sin(n\cdot p) \quad (2)$$

$$rn=ro\cdot\cos(n\cdot p)-(R^2-ro^2)^{1/2}\cdot\sin(n\cdot p) \quad (3)$$

where, R is the target radius of the crystal.

The interpolated light measuring line Bn—Bn is determined, based on the right intersection point position on the base light measuring line Bo—Bo by the numerical equation (3) when the crystal rotates clockwise, and by the numerical equation (2) when it rotates counterclockwise.

The crystal shape measuring method of the present invention determines the measurement angle pitch P by the camera's response speed s (rpm) and crystal rotational speed v (sec.) using the numerical equation (1), and the distance rn (mm) of the interpolated light measuring line Bn—Bn (n=1, . . . , k−1) from the crystal section center O by the measurement angle pitch p (equal to P/k) using the numerical equation (2) or (3), to automatically set the interpolated light measuring lines Bn—Bn (n=1, . . . , k−1) together with the base light measuring line Bo—Bo.

When the base light measuring line Bo—Bo and interpolated light measuring lines Bn—Bn (n=1, . . . , k−1) are automatically set, the intersection points C and C are separately detected on each light measuring line. The detected positions of the intersection points on both sides on the base light measuring line Bo—Bo are Lo(α) and Ro(α), and those on the interpolated light measuring line Bn—Bn (n=1, . . . , k−1) are Ln(α) and Rn(α) (n=1, . . . k−1), where α is the crystal rotational angle.

When the interpolated light measuring lines Bn—Bn (n=1, . . . , k−1) are set, based on the left intersection point position on the base light measuring line Bo—Bo, while the crystal rotates clockwise, the left intersection point position Ln(α) (n=k−1) on the interpolated light measuring line Bn—Bn (n=1, . . . , k−1) is due to the crystal shape appearing behind the Lo(α) (the left intersection point position on the base light measuring line Bo—Bo) by n×p. On the other hand, the right intersection point position Rn (α) (n=1, . . . , k−1) on the interpolated light measuring line Bn—Bn (n=1, . . . , k−1) is due to the crystal shape appearing ahead of the Ro(α) (the right intersection point position on the base light measuring line Bo—Bo) by n×p.

These intersection points Ln(α) and Rn(α) (n=1, . . . , k−1) have been overlooked by the conventional method, because of the insufficient response speed of the camera.

The diameter of a single crystal will not inherently change sharply, except when the light measuring line crosses the crystal habit line, to give essentially constant detected positions of the intersection points on both sides. In actuality, however, the detected positions will change by the shaking motion of the single crystal, even when the light measuring line is apart from the crystal habit line. This positional change is another major cause, together with the timing lag θ for detecting the positions of the intersection points on both sides, for the decreased accuracy of the measurement of a single crystal diameter.

The crystal shape measuring method of the present invention removes the component due to the shaking motion of the single crystal from each of the detected intersection points Lo(α), Ro(α), Ln(α) and Rn(α) (n=1, . . . , k−1). This procedure is described below, taking the detected positions L(α) and R(α).

A Fast Fourier Transform (FFT) is applied to the detected positions L(α) and R(α) of the intersection points on both sides, to find the frequency component as a function of time for each position. The frequency component of the detected position L(α) or R(α), represented by f(x), is given by the following numerical equation (4):

$$f(x) = \sum_{n=0}^{m} a_n \sin(nx + \alpha_n) \qquad (4)$$

where, f(x) is the detected positional data of the intersection points, x is the crystal rotational angle, $a_n$ is the n-th order component amplitude, and $\alpha_n$ is the phase difference of n-th order component.

Figure 4:
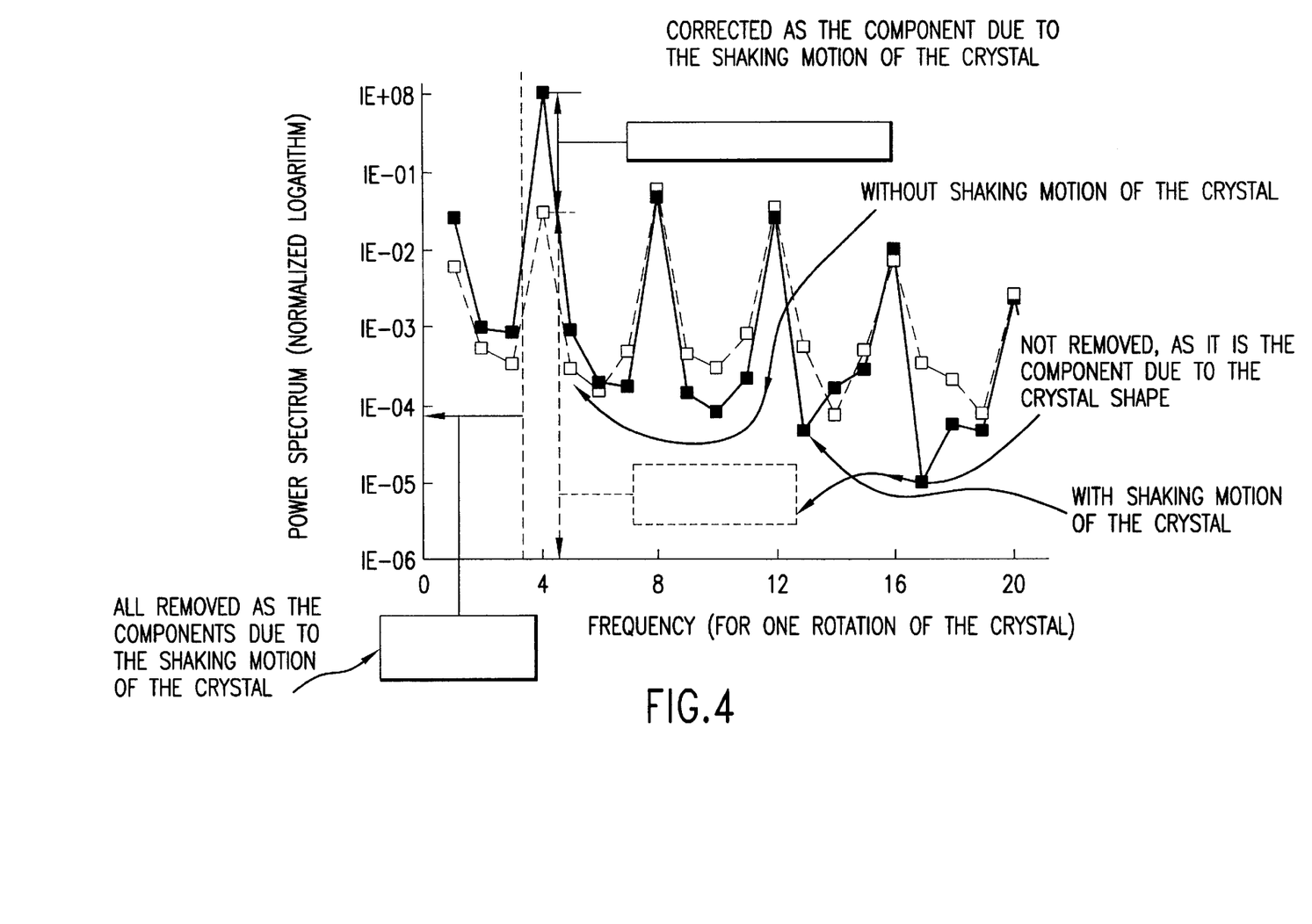
FIG. 4 shows the frequency components of the detected positional data of the intersection points on both sides.

The solid line in FIG. 4 represents the frequency component of f(x), whereas the broken line in the figure represents the frequency component for the case substantially free of the shaking motion of the single crystal.

The single crystal shakes, while being pulled, at a frequency of 1 to 4 oscillations for each rotation. The frequency components of lower orders, corresponding to the shaking frequency (1 to 4 oscillations for each rotation), are removed as the ones caused by the shaking motion of the single crystal. Removing all of the components due to the shaking motion would increase measurement error. For example, 4 crystal habit lines appear at intervals of 90° at the crystal orientation (100), and removing the frequency components to the 4-th order removes so far as the one due to the crystal shape occurring up to 4 times for each rotation. Therefore, as shown in FIG. 4 the first- to third-order components (amplitudes) are totally removed as the ones caused by the shaking motion of the single crystal, and the fourth component is removed, after being subtracted by the frequency component when the single crystal does not shake or shakes to a very small extent (which is predetermined offline), as the one caused by the shaking motion of the single crystal. In other words, the frequency component when the single crystal does not shake or shakes to a very small extent is left intact. This procedure yields the numerical equation (5):

$$F(x)=f(x)-\{a_1 \sin(x+\alpha_1)+a_2 \sin(2x+\alpha_2)+a_3 \sin(3x+\alpha_3)+(a-A)\sin(4x+\alpha_4)\} \qquad (5)$$

where,

F(x) is the corrected data, and

A is the amplitude of the fourth-order component, due to the crystal shape (to be predetermined).

Even the frequency component for the case substantially free of the shaking motion of the single crystal, represented by the broken line in FIG. 4, contains the spectra in the first to third-order terms. The. single crystal of orientation (100) has no component due to crystal shape in the first- to third-order terms, from which it is judged that the spectra in the first- to third-order terms result from the very small shaking motion of the crystal, 0.2 mm or less in amplitude.

Figure 5:
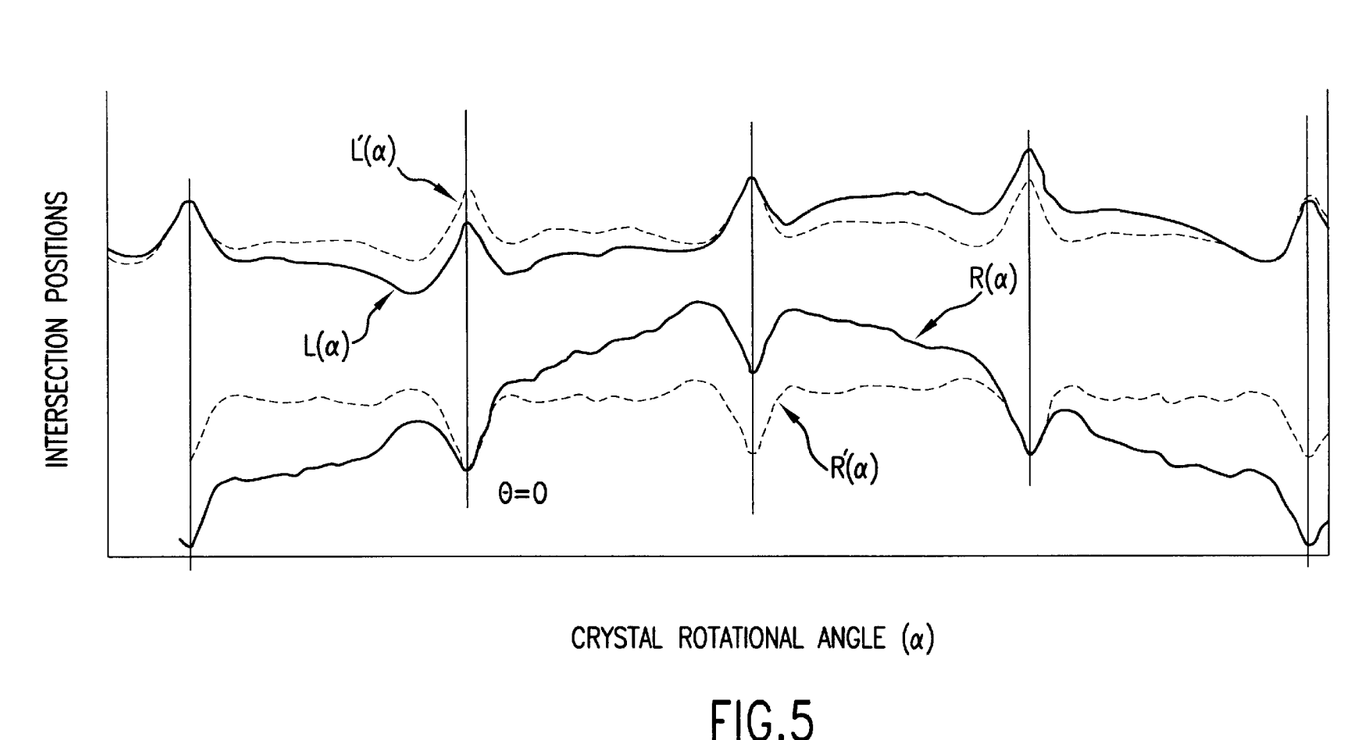
FIG. 5 shows the detected positional data of the intersection points on both sides, with and without the effect of the shaking motion of the crystal.

Removal of the components due to the shaking motion of the single crystal gives the detected positions of the intersection points of Lo'(α), Ro'(α), Ln'(α) and Rn' (α) (n=1, ..., k−1), which correspond to Lo(α), Ro(α), Ln(α) and Rn(α) (n=1, ..., k−1), as shown in FIG. 5.

The positions Lo(α) and Ro(α) detected on the measuring line Bo—Bo cannot be directly compared with the positions Ln (α) and Rn (α) (n=1, ..., k−1) detected on the line Bn—Bn, because these measuring lines are apart from the crystal center O and different from each other in the distance (r) from the crystal center O, ro and rn. Therefore, each detected position is transformed into the position on the line passing through the crystal center O using the numerical equations (6), where (c) is the crystal center position:

$$Lo"(\alpha)=[(c-Lo'(\alpha))^2+ro^2]^{1/2} Ln"(\alpha)=[(c-Ln'(\alpha))^2+rn^2]^{1/2}$$
$$Ro"(\alpha)=[(Ro'(\alpha)-c)^2+ro^2]^{1/2} Rn"(\alpha)=[(Rn'(\alpha)-c)^2+rn^2]^{1/2} \qquad (6)$$

The timing lags θ for detecting the positional changes of the intersection points can be found from detection time lags between the left and right positions, i.e., between Lo"(α) and Ro"(α) and between Ln"(α) and Rn"(α), as shown in FIG. 5. In order to remove the timing lag θ, the distance between the intersection points on both sides of each line, Wo(α) or Wn(α), is found using the numerical equations (7) when the crystal rotates clockwise or the numerical equations (8) when the crystal rotates counterclockwise:

$$Wo(\alpha)=Ro"(\alpha+\theta)-Lo"(\alpha) \quad Wn(\alpha)=Rn"(\alpha+\theta)-Ln"(\alpha) \qquad (7)$$

$$Wo(\alpha)=Ro"(\alpha)-Lo"(\alpha+\theta) \quad Wn(\alpha)=Rn"(\alpha)-Ln"(\alpha+\theta) \qquad (8)$$

The detected positions Lo"(α), Ro"(α), Ln(α) and Rn(α) are transformed into the positions on the measuring line passing through the crystal center, and Wo(α) and Wn(α) thus represent the crystal diameters.

Thus, the crystal section shape measuring method of the present invention measures the crystal diameters at intervals of the measurement pitch p (equal to P/k), although optically measuring them at intervals of the measurement pitch P. This allows accurate measurement of the sectional shapes in the vicinity of the crystal habit line, by the aid of an inexpensive, two-dimensional CCD camera of low response speed.

Figure 6:
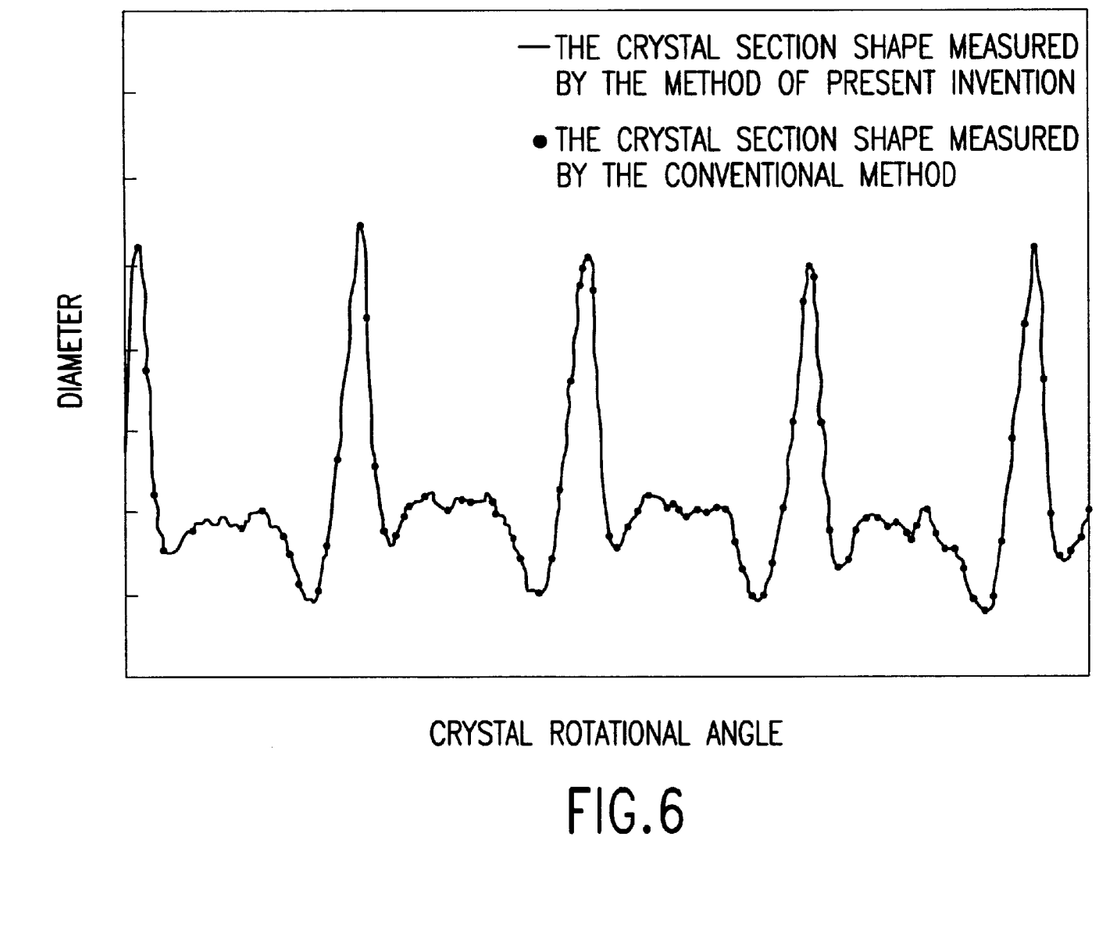
FIG. 6 compares the crystal section shape measured by the method of present invention with that measured by the conventional method.

FIG. 6 compares the changed crystal diameter or sectional shape measured by the method of the present invention with that measured by the conventional method. The two-dimensional CCD camera used for the present invention can take images at intervals of the crystal rotational angle of 4°. It is difficult for the conventional method to accurately measure the crystal section shape, because of its measurement angle pitch being sufficiently large to overlook the peak in the vicinity of the crystal habit line. The method of the present invention sets 3 interpolated measuring lines in this case to have a speed angle pitch of 1°, allowing virtually continuous measurement to accurately determine the crystal section shape in spite of an inexpensive camera being used.

As discussed above, the crystal section shape measuring method of the present invention sets two or more horizontal light measuring lines, arranged in parallel to each other in the vertical direction, in the image taken by a two-dimensional CCD camera, and interpolates the space between the measurement pitches determined by the camera's response speed and crystal rotational speed, in order to allow diameter measurement at intervals of a pitch of 2° or less, even when the single crystal is pulled at a high speed by the aid of an inexpensive, ordinary two-dimensional CCD camera. As a result, the method of the present invention can accurately and economically measure sectional shapes of the single crystal.

Accuracy of the section shape measurement by the method of the present invention can be further improved by removing the measurement error caused by the timing lag for detecting the positional changes of the intersection points on both sides, observed in the vicinity of the crystal habit line, and/or removing the effect of the shaking motion of the single crystal.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A method of measuring a crystal section shape of a crystal being pulled from a crystal melt while rotating, comprising:

taking an image of a base of the crystal in horizontal and vertical directions with a two-dimensional camera set at an upper oblique position over the crystal;

setting at least two horizontal light measuring lines in the image taken by the two-dimensional camera, said at least two horizontal light measuring lines being arranged in parallel in the vertical direction;

detecting pairs of intersection points at which a fusion ring intersects said at least two horizontal light measuring lines;

combining the pair of the intersection points obtained on each light measuring line to interpolate the space between measurement pitches, determined by the camera response speed and rotational speed; and determining diameters of said crystal based on combining and on a time lag between two intersection points of each of said pairs of intersection points.

2. The method according to claim 1, further comprising transmitting a rotational speed of the crystal to a processing unit.

3. The method of claim 1, further comprising:

applying a Fast Fourier Transform to said position of each of said intersection points, and subtracting frequency components representing a shaking motion of the crystal as the crystal rotates.

4. The method according to claim 1, further comprising scanning one of said at least two horizontal light measuring lines in the vertical direction in the image taken by the two-dimensional camera, during a seed drawing step, determining a scanning position where said scanned horizontal light measuring line has two intersection points intersecting the fusion ring with a largest distance separating said two intersection points, and determining a crystal center position by finding the midpoint between said two intersection points.

5. The method according to claim 1, wherein said crystal is a single crystal.

6. The method according to claim 1, wherein taking an image with a two-dimensional camera comprises taking an image with a two-dimensional CCD camera.

7. The method according to claim 1, wherein detecting said pairs of intersection points comprises separately detecting the intersection points.

8. A method of measuring a crystal section shape of a crystal being pulled from a crystal melt while rotating, comprising:

taking an image of a base of the crystal in horizontal and vertical directions with a two-dimensional camera set at an upper oblique position over the crystal;

setting at least two horizontal light measuring lines in the image taken by the two-dimensional camera, said at least two horizontal light measuring lines being arranged in parallel in the vertical direction;

detecting pairs of intersection points at which a fusion ring intersects said at least two horizontal light measuring lines;

combining the pair of the intersection points obtained on each light measuring line to interpolate the space between measurement pitches, determined by the camera response speed and rotational speed;

determining diameters of said crystal based on the combining, wherein said setting step comprises setting n+1 horizontal light measuring lines, and determining said number n is based on said rotational speed of the crystal and on a response time of said camera.

9. A method of measuring a crystal section shape of a crystal being pulled from a crystal melt while rotating, comprising:

taking an image of a base of the crystal in horizontal and vertical directions with a two-dimensional camera set at an upper oblique position over the crystal;

setting at least two horizontal light measuring lines in the image taken by the two-dimensional camera, said at least two horizontal light measuring lines being arranged in parallel in the vertical direction;

detecting pairs of intersection points at which a fusion ring intersects said at least two horizontal light measuring lines;

combining the pair of the intersection points obtained on each light measuring line to interpolate the space between measurement pitches, determined by the camera response speed and rotational speed;

determining diameters of said crystal based on the combining, wherein said setting step comprises setting n+1 horizontal light measuring lines, and determining said number n is based on said rotational speed of the crystal and on a response time of said camera, and wherein determining said number n is performed so that two intersection points located consecutively on the fusion ring are separated by an angle less than or equal to 2°.

10. A method of measuring a crystal section shape of a crystal being pulled from a crystal melt while rotating, comprising:

taking an image of a base of the crystal in horizontal and vertical directions with a two-dimensional camera set at an upper oblique position over the crystal;

setting at least two horizontal light measuring lines in the image taken by the two-dimensional camera, said at least two horizontal light measuring lines being arranged in parallel in the vertical direction;

detecting pairs of intersection points at which a fusion ring intersects said at least two horizontal light measuring lines;

combining the pair of the intersection points obtained on each light measuring line to interpolate the space between measurement pitches, determined by the camera response speed and rotational speed;

determining diameters of said crystal based on the combining, wherein said setting step comprises setting n+1 horizontal light measuring lines, and determining said number n is based on said rotational speed of the crystal and on a response time of said camera, and wherein setting n+1 horizontal light measuring comprises:

setting a base light measuring line at a distance ro from said crystal center, and setting n light measuring lines at a distance rn from said crystal center, given by $rn = ro \cdot \cos(n \cdot p) + (R^2 - ro^2)^{1/2} \cdot \sin(n \cdot p)$, when the crystal rotates clockwise, and by
$rn = ro \cdot \cos(n \cdot p) - (R^2 - ro^2)^{1/2} \cdot \sin(n \cdot p)$, when the crystal rotates counterclockwise, where R is a target radius of the crystal, and $p = P/(n+1)$, P being measurement angle pitch given by $$P = 360\left(\frac{60}{s \times v}\right)$$

s being said rotational speed of the crystal and v being said response time of the camera.

* * * * *